US006918178B2

(12) United States Patent
Chao et al.

(10) Patent No.: US 6,918,178 B2
(45) Date of Patent: Jul. 19, 2005

(54) METHOD OF ATTACHING A HEAT SINK TO AN IC PACKAGE

(75) Inventors: Shin-Hua Chao, Kaohsiung (TW); Shyh-Ing Wu, Kaohsiung Hsien (TW); Kuan-Neng Liao, Kaohsiung (TW); Gin-Nan Yeh, Tainan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 116 days.

(21) Appl. No.: 10/345,929

(22) Filed: Jan. 17, 2003

(65) Prior Publication Data

US 2003/0106212 A1 Jun. 12, 2003

Related U.S. Application Data

(62) Division of application No. 09/599,833, filed on Jun. 23, 2000, now abandoned.

(30) Foreign Application Priority Data

Apr. 8, 2000 (TW) ........................................ 89106555 A

(51) Int. Cl.[7] ................................................. H05K 3/30
(52) U.S. Cl. ............................. 29/841; 29/417; 29/832; 29/837; 174/261; 361/687; 361/704; 361/760; 361/761; 361/764; 83/25; 83/42; 83/103; 264/272.11
(58) Field of Search ........................ 29/417, 832, 837, 29/841; 174/260, 261; 361/687, 704, 760, 761, 764; 83/25, 42, 103; 264/272.11

(56) References Cited

U.S. PATENT DOCUMENTS

| 4,038,040 A | * | 7/1977 | Nagl ........................... 428/596 |
| 4,090,231 A | | 5/1978 | Millard et al. |
| 4,405,971 A | | 9/1983 | Ohsawa |
| 4,535,384 A | | 8/1985 | Wakabayashi et al. |
| 4,926,242 A | | 5/1990 | Itoh et al. |
| 5,208,732 A | | 5/1993 | Baudouin et al. |
| 5,298,686 A | | 3/1994 | Bourdelaise et al. |
| 5,299,091 A | | 3/1994 | Hoshi et al. |
| 5,371,654 A | | 12/1994 | Beaman et al. |
| 5,377,077 A | | 12/1994 | Burns |
| 5,386,341 A | | 1/1995 | Olson et al. |
| 5,420,460 A | | 5/1995 | Massingill |
| 5,455,382 A | | 10/1995 | Kojima et al. |
| 5,614,443 A | | 3/1997 | Nakashima et al. |
| 5,648,893 A | * | 7/1997 | Loo et al. .................... 361/820 |
| 5,706,579 A | | 1/1998 | Ross |
| 5,745,344 A | * | 4/1998 | Baska et al. ................. 361/705 |
| 5,773,362 A | * | 6/1998 | Tonti et al. .................. 438/665 |
| 5,848,467 A | * | 12/1998 | Khandros et al. ............. 29/841 |
| 5,988,488 A | | 11/1999 | Slattery et al. |

FOREIGN PATENT DOCUMENTS

| JP | 60155600 A | * | 8/1985 | ........... C30B/33/00 |
| JP | 07074291 A | * | 3/1995 | ......... H01L/23/373 |

OTHER PUBLICATIONS

"Thermal Comparison of Flip–Chip Relative to Chip–and–Wire Semiconductor Attachment in Hybrid Circuits: An Experimental Approach"; Cavanaugh, D.;Parts, Hybrids, and Packaging, IEEE Transactions on , vol.: 12 , Issue: 4 , Dec 1976; pp.:29–298.*

* cited by examiner

*Primary Examiner*—Paul Kim
(74) *Attorney, Agent, or Firm*—Birch, Stewart, Kolasch & Birch, LLP

(57) ABSTRACT

An improved method of integrally attaching a heat sink to an IC package for enhancing the thermal conductivity of the package. A heat sink matrix, which is dividable into a plurality of individual heat sinks, is attached to an IC package matrix, which is comprised of a plurality of individual IC packages abutting each other in a matrix arrangement. The IC package matrix and the heat sink matrix attached thereto are then simultaneously cut by means of a machine tool into a plurality of individually formed IC packages each with a heat sink attached; thereby, thermal conductivity of a conventional IC package is enhanced.

11 Claims, 6 Drawing Sheets

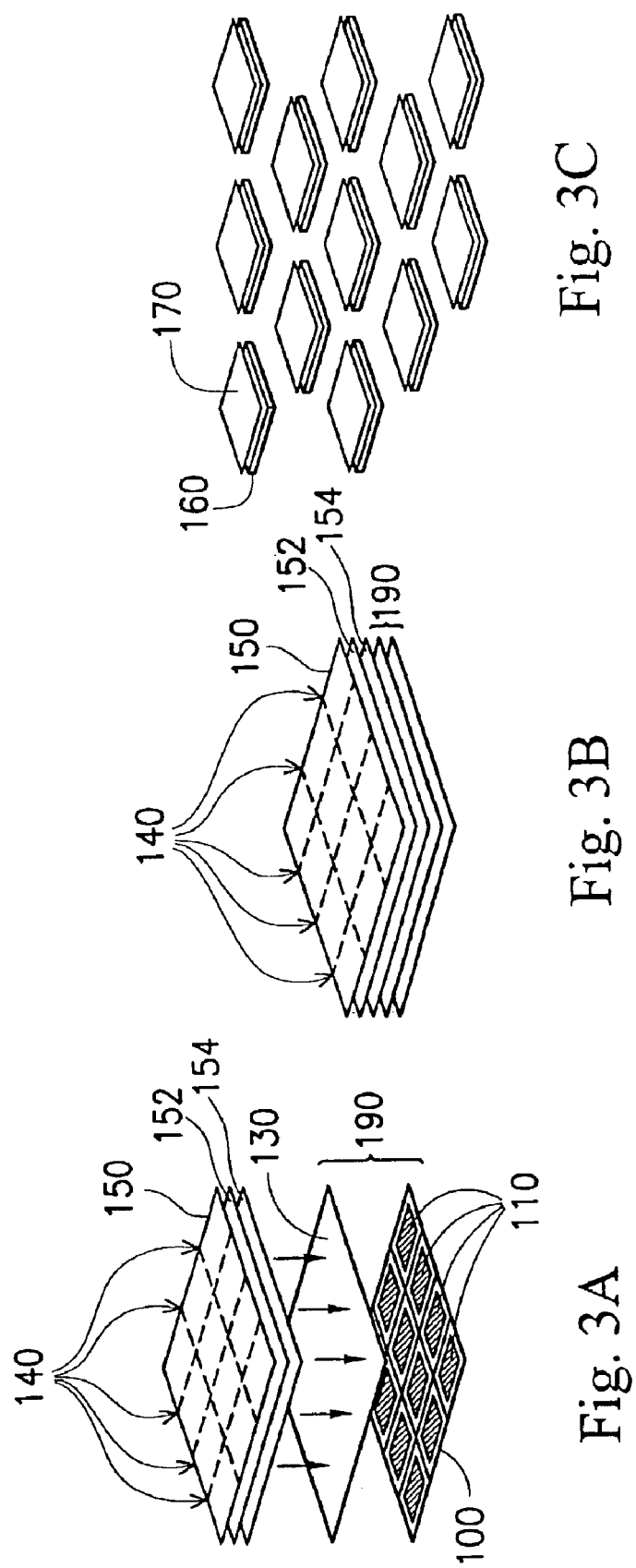

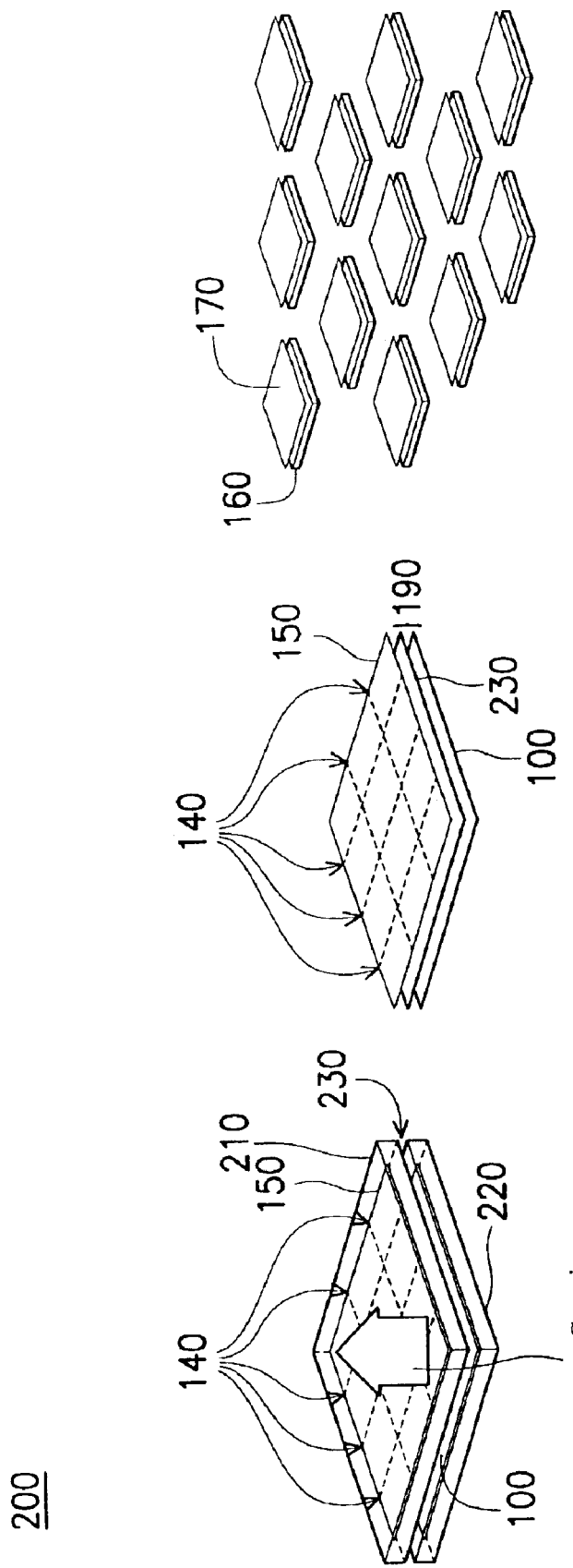

METHOD OF ATTACHING A HEAT SINK TO AN IC PACKAGE

This application is a divisional of application Ser. No. 09/599,833, filed on Jun. 23, 2000, now abandoned the entire contents of which are hereby incorporated by reference and for which priority is claimed under 35 U.S.C. § 120; and this application claims priority of Application No. 89106555 filed in TAIWAN on Apr. 8, 2000 under 35 U.S.C. § 119.

BACKGROUND OF THE INVENTION

1. Field of the Invention

The present invention generally relates to a method of attaching a heat sink to an integrated circuit package (referred to as IC package hereinafter); more specifically, the present invention relates to an improved method of integrally attaching a heat sink to an IC package for enhancing the thermal conductivity of the package.

2. Description of Prior Art

Conventionally, IC packaging is generally related to a process of packaging a semiconductor die comprising the steps of adhering a semiconductor die to the surface of a supporting substrate, connecting the bond pads to the supporting substrate by means of wire bonding, and encapsulating the molding material to protect the semiconductor die from the environmental contaminants.

A conventional IC package such as a dual inline package can have a relatively small number of pin count, where as a more recently developed ball grid array package (referred to as BGA package hereinafter), in comparison, is provided with a larger amount of pin count as show in FIG. 1. Furthermore, in order to meet the popular demand for electronic components of ever-decreasing sizes, a chip size packaging (referred to as CSP hereinafter) was later developed in order to achieve an IC package such that the dimensions of the semiconductor die encapsulated in the package is almost the same as those of the package itself (e.g. within 20% dimensional differences).

FIG. 1 shows a cross sectional view of a semiconductor die suitably encapsulated by a conventional BGA package. The device shown in FIG. 1 comprises a substrate 1, a semiconductor die 3 which is adhered to the top surface of the substrate 1 by an adhesive layer 2, a plurality of metal wires 4 each correspondingly connecting between a bond pad 3a and the substrate 1, a molding material 5 disposed on the substrate 1 for encapsulating both the wafer die 3 and the wires 4, and a plurality of solder balls 6 mounted to the underside of the substrate 1.

Moreover, it is a common conventional practice to attach or mount a heat sink to the surface of the IC package which is necessary for enhancing the thermal conductivity of the IC package. However, since the semiconductor die is encapsulated by a chip size BGA package, it is very difficult to operate a cost effective IC packaging process if the chip size heat sink is to be successfully mounted to the surface of the IC package every time. As a result, some types of IC package do not even include any heat sink in order to reduce the overall packaging cost by circumventing the technology required for mounting the heat sink, which makes the encapsulated semiconductor die especially a die containing high performance circuits, prone to temperature-related damages and lower operating efficiency.

Referring to FIG. 2A through FIG. 2C, the process of mounting a heat sink 13 to the surface of an IC package 10 according to a conventional method is shown, wherein the IC package 10 comprises a substrate 11 and thereon a molding material 12 encapsulating at least a high performance semiconductor die 3 in between.

Conventionally, a plurality of semiconductor dies are disposed by a matrix layout plan on a communal substrate (not shown) in order to be encapsulated collectively by a packaging (CSP) process to form a plurality of IC packages abutting each other in a matrix arrangement. A cutting or separation procedure is then performed to separate the interconnected IC packages into a plurality of individually formed IC packages 10 in which at least a semiconductor die 3 is encapsulated in between a chip-sized molding material 12 and a chip-sized substrate 11, as shown in FIG. 2A. Then, as shown in FIG. 2B, a heat sink 13 having roughly the same cross dimensions as the IC package 10 is attached to the surface of molding material 12. Typically, as shown in FIG. 2C, the heat sink 13 is fastened to the surface of molding material 12 by a plurality of clips 15.

However, as described above, mounting the chip-sized heat sink 13 accurately to the IC package 10 formed by CSP is a process that requires a high mounting precision, which can adversely increase the overall packaging cost and time. Therefore, due to the aforementioned chip size nature of the IC package 10, it is very difficult to control the precision in aligning the heat sink 13 to the IC package 10 while trying to raise the throughput during actual IC packaging practices.

SUMMARY OF THE INVENTION

In view of the above-described disadvantages, it is an object of the present invention to provide an improved method of mounting a heat sink to the surface of an IC package for enhancing the thermal conductivity of the IC package.

Accordingly, the first embodiment of the present invention provides a method of integrally attaching a heat sink to an IC package. First, an IC package matrix, which is comprised of a plurality of interconnected IC packages abutting each other in a matrix arrangement, is formed by collectively encapsulating a plurality of semiconductor dies disposed on a communal substrate in a matrix arrangement. Then, a heat sink matrix, which is comprised of a plurality of interconnected heat sinks abutting each other in the same matrix arrangement as the IC package matrix, is aligned with said IC package matrix in overlapping positions before being mounted thereto. The heat sink matrix is the attached to the top of the IC package matrix by means of an adhesive. Subsequently, said IC package matrix and thereto attached heat sink matrix, are cut by means of a machine tool into a plurality of individually formed IC packages each with an attached heat sink.

The second embodiment of the present invention provides another method of integrally attaching a heat sink to a communal substrate with a plurality of semiconductor dies fixedly attached thereon by means of a shape-forming molding apparatus. First, a communal substrate is provided, on which a plurality of semiconductor dies are fixedly disposed in a matrix arrangement. Then, a heat sink matrix having the same matrix arrangement and cross dimensions as the communal substrate is provided, which is dividable into a plurality of individual heat sinks. Then, the communal substrate and the heat sink matrix are placed into a shape-forming molding apparatus comprising an upper mold half and a lower mold half. In particular, the communal substrate with a plurality of semiconductor dies fixedly attached thereon is disposed inside the lower mold half while the heat sink matrix is suspended inside the upper mold half by means of vacuum suction. The upper and lower mold halves of the molding apparatus are then closed to form a cavity inside the molding apparatus in which the heat sink matrix is suspended directly above the communal substrate with a plurality of semiconductor dies fixedly attached thereon in a coplanar positions. A melted molding material is then injected into the molding apparatus to collectively encapsulate the semiconductor dies fixedly attached on the communal substrate so as to form an IC package matrix integrated with the heat sink matrix. In addition, as the melted molding material is injected into the molding apparatus, the molding material also immerses the heat sink matrix suspended directly above the communal substrate. Thereby, the IC package matrix is integrated with the heat sink matrix after the molding material is permanently set. Subsequently, the encapsulated IC package matrix, together with the integrally attached heat sink matrix, is cut into a plurality of individually formed IC packages each having an integrally attached heat sink by means of mechanical cutting tool.

Therefore, the present invention is related to an improved method of integrally attaching a heat sink to an IC package by attaching a heat sink matrix, which is dividable into a plurality of individual heat sinks, to an IC package matrix, which is comprised of a plurality of individual IC packages abutting each other in a matrix arrangement, in coplanar positions. The IC package matrix and the heat sink matrix attached thereto are then simultaneously cut into a plurality of individually formed IC packages each having an integrally attached heat sink. Hence, the present invention provides the advantage of enhanced thermal conductivity of a conventional IC package without raising the level of mounting technology required to maintain a high packaging throughput.

BRIEF DESCRIPTION OF THE DRAWINGS

This and other objects and features of this invention will become clear from the following description, taken in conjunction with the preferred embodiments with reference to the accompanied drawings, in which:

FIG. 3A, FIG. 3B and FIG. 3C show the process of collectively mounting a heat sink onto the surface of an individual IC package according to an embodiment of the present invention;

FIG. 4A, FIG. 4B, and FIG. 4C show the process of collectively mounting a heat sink onto the surface of an individual IC package by means of a molding apparatus according to another embodiment of the present invention;

DETAILED DESCRIPTION OF THE PREFERRED EMBODIMENTS

First Embodiment

Figure 1:
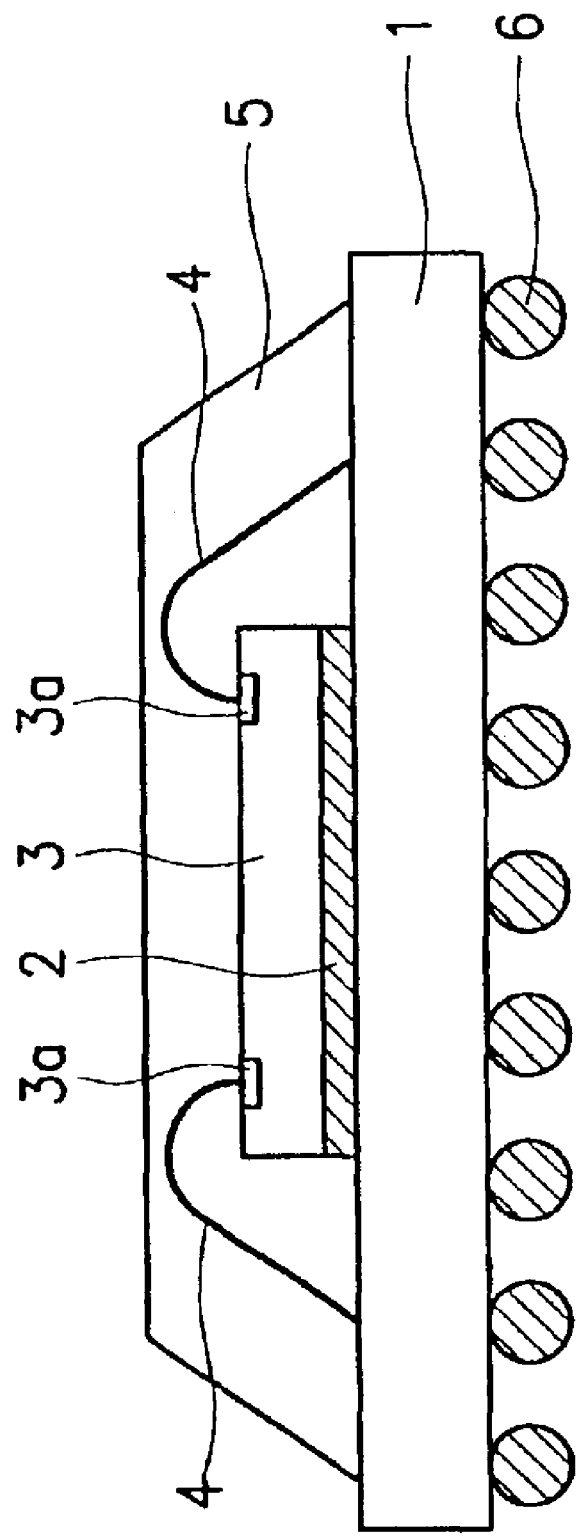
FIG. 1 shows a cross sectional view of a semiconductor die encapsulated by a conventional BGA package.
Figure 2A:
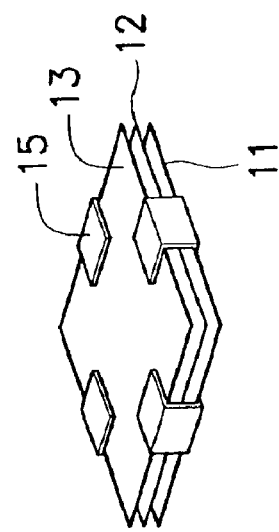
FIG. 2A, FIG. 2B, and FIG. 2C collectively show the process of mounting a heat sink onto the surface of an individual IC package according to a conventional method.
Figure 2B:
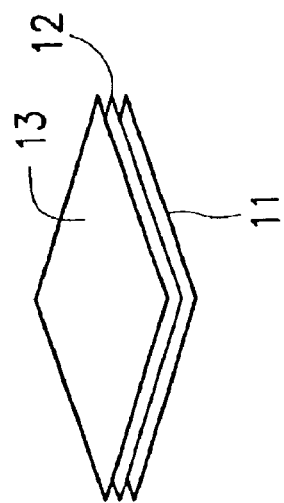
Figure 2C:
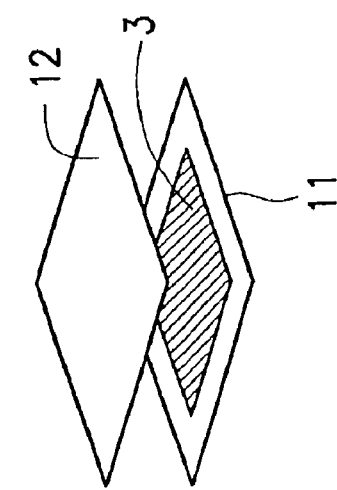

FIG. 3A, FIG. 3B, and FIG. 3C show the process of collectively mounting a heat sink onto the surface of an individual IC package by means of a matrix layout plan according to an embodiment of the present invention.

Referring to FIG. 3A, an IC package matrix 190 is comprised of a plurality of semiconductor dies 110 fixedly, attached to a communal substrate 100 in a matrix arrangement, which is encapsulated collectively by a molding material 130 during an encapsulation process. The encapsulation process given herewith is relevant to a packaging process for the ball grid array (BGA) packages. As shown in FIG. 3A, an IC package matrix 190 of 3×4 arrays, which is dividable into a plurality of the above-mentioned BGA packages, is encapsulated in a molding material 130 as a whole.

Referring to FIGS. 3A through 3C, a heat sink matrix 150 dividable into a plurality of heat sinks 170 each sized to meet the heat dissipation requirement of the BGA package is attached to the IC package matrix 190 from the top in coplanar positions. The heat sink matrix 150 is typically made of Cu, Al, or an alloy of which for providing a greater heat-dissipating efficiency. In addition, a layer of film 152 made of Cr, $Cr_2O_3$, or Ni is plated on the heat sink matrix 150 so as to enhance the adhesion between the heat sink matrix 150 and the molding material 130 as well as to provide a smoother finish. In particular, the choices of the adhesives used for adhering the heat sink matrix 150 to the IC package matrix 190 include an adhesive coating 154 made of epoxy or an adhesive tape (not shown), for example, applied between the heat sink matrix 150 and the IC package matrix 190.

Referring to FIG. 3C, a plurality of individually formed IC packages 160 each having a heat sink 170 integrally attached are thus formed after the above-mentioned IC package matrix 190 and overlapping heat sink matrix 150 are cut simultaneously by means of a cutting tool (not shown).

Referring to FIG. 3A and FIG. 3B, a notch grid 140 constituted of a network of notches, which corresponds to the dividing lines for outlining each individual IC package 160, is pre-fabricated on the surface of the heat sink matrix 150 before being attached to the IC package matrix 190. The notch grid 140 is pre-fabricated on the surface of the heat sink matrix 150 by means of a machine tool or an etching step for the ease of separating the IC package matrix 190 and the overlapping heat sink matrix 150 into a plurality of IC packages 160 each having an attached heat sink 170.

Second Embodiment

FIG. 4A, FIG. 4B, and FIG. 4C show the process of collectively mounting a heat sink onto the surface of an individual IC package by means of a molding apparatus according to another embodiment of the present invention.

Referring to FIG. 4A a communal substrate 100 is provided, on which a plurality of semiconductor dies (not shown) are pre-fabricated in a matrix arrangement. Referring to FIGS. 4A and 4C, a heat sink matrix 150, which is dividable into a plurality of heat sinks 170, having the same matrix arrangement as described above is provided. Then referring to FIG. 4A, the communal substrate 100 with a plurality of semiconductor dies provided thereon and the heat sink matrix 150 are both placed into a shape-forming molding apparatus comprising an upper mold half 210 and a lower mold half 220.

Referring to FIG. 4A, the communal substrate 100 with a plurality of semiconductor dies provided thereon is disposed inside the lower mold half 220, and the heat sink matrix 150 is held on the upper mold half 210 by means of vacuum suction. The upper and lower mold halves of the molding apparatus are then combined such that inside the molding apparatus the heat sink matrix 150 is suspended above the communal substrate 100 with a plurality of semiconductor dies provided thereon in coplanar positions. A melted molding material 230 is then injected into the molding apparatus to collectively encapsulate the semiconductor dies fixedly attached on the communal substrate 100 so as to form an IC package matrix 190 integrated with the heat sink matrix 150.

Referring to FIG. 4B, the 3×4 IC package matrix 190 in which the 3×4 semiconductor dies are encapsulated, and the heat sink matrix 150 are thus integrally molded together by the solidified molding material 230 after being extracted from the molding apparatus. Since the melted molding material 230 shrinks in volume as the temperature decreases, the heat sink matrix 150 is therefore tightly clamped to the IC package matrix 190 after the molding material 230 is set.

Referring to FIG. 4C, the encapsulated IC package matrix 190 integrated with the heat sink matrix 150 is subsequently cut into a plurality of individually formed IC packages 160 each having an integrally attached heat sink 170 by a mechanical cutting tool.

The heat sink matrix 150 is typically made of Cu, Al, or an alloy of which for providing a greater heat-dissipating efficiency. In addition, as described in the first embodiment, a layer of film 152 made of Cr, $Cr_2O_3$, or Ni can also be plated on the heat sink matrix so as to enhance the adhesion between the heat sink matrix 150 and the molding material 230 as well as to provide a smother finish.

Figure 5:
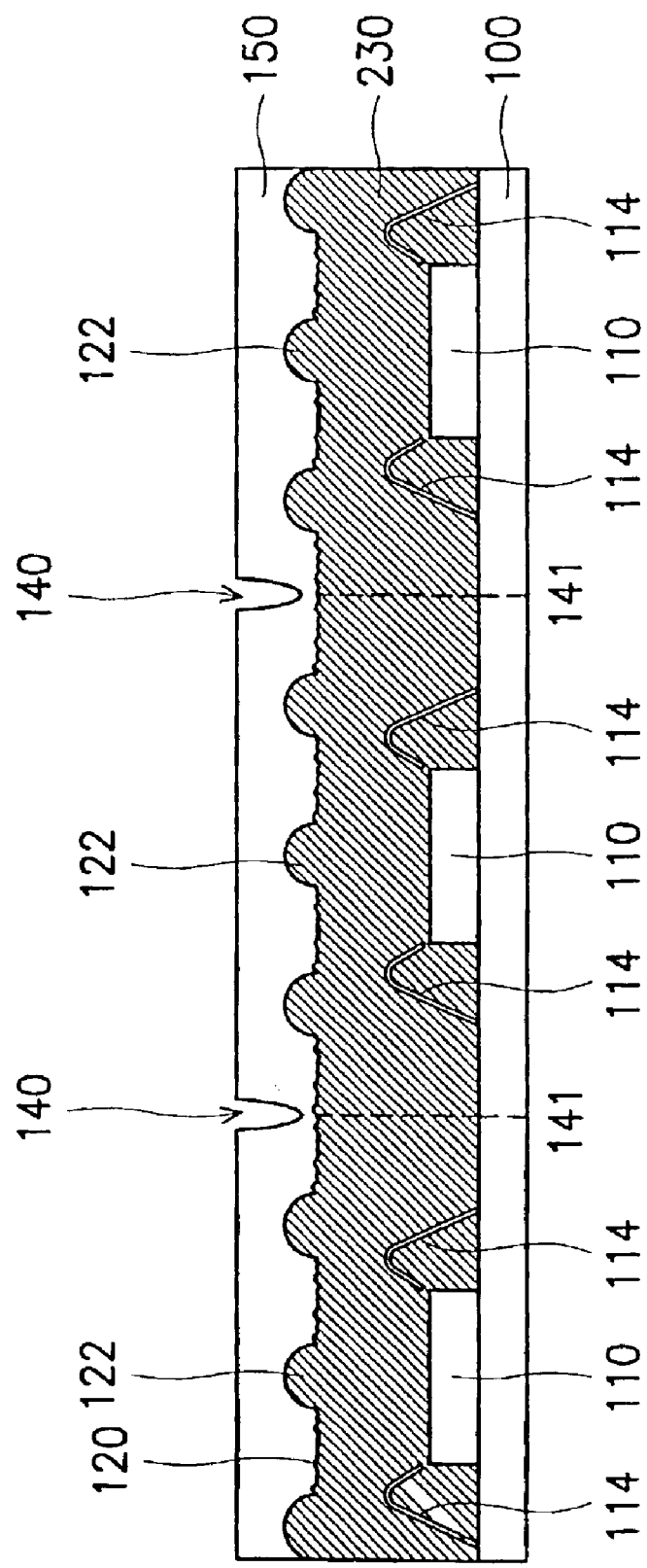
FIG. 5 is a cross-sectional view of an IC packages matrix with an integrally attached heat sink matrix according to an embodiment of the present invention.

Referring to FIG. 5, FIG. 5 is a cross-sectional view of an IC packages matrix with an integrally attached heat sink matrix as shown in FIG. 4B. In the second embodiment the heat sink matrix 150 has a surface 120 contacting the molding material 230 after the heat sink assembly 150 and the IC package matrix are integrally molded together. Before the heat sink matrix 150 is placed into the molding apparatus, the contacting surface 120 of the heat sink matrix 150 is roughened by a roughening procedure such as an anodization method provide by Texas Instruments™, for enhancing the adhesion of the heat sink matrix 150 to the molding material 230 encapsulating the dies 110 on the substrate 100. In the first embodiment, before the heat sink matrix 150 is adhered to the IC matrix package 190, one surface of the heat sink matrix 150 or the IC matrix package 190 may be roughened for enhancing the adhesion of the heat sink matrix 150 or the IC matrix package 190 to the adhesive for adhering the heat sink matrix to the IC matrix package.

Figure 6:
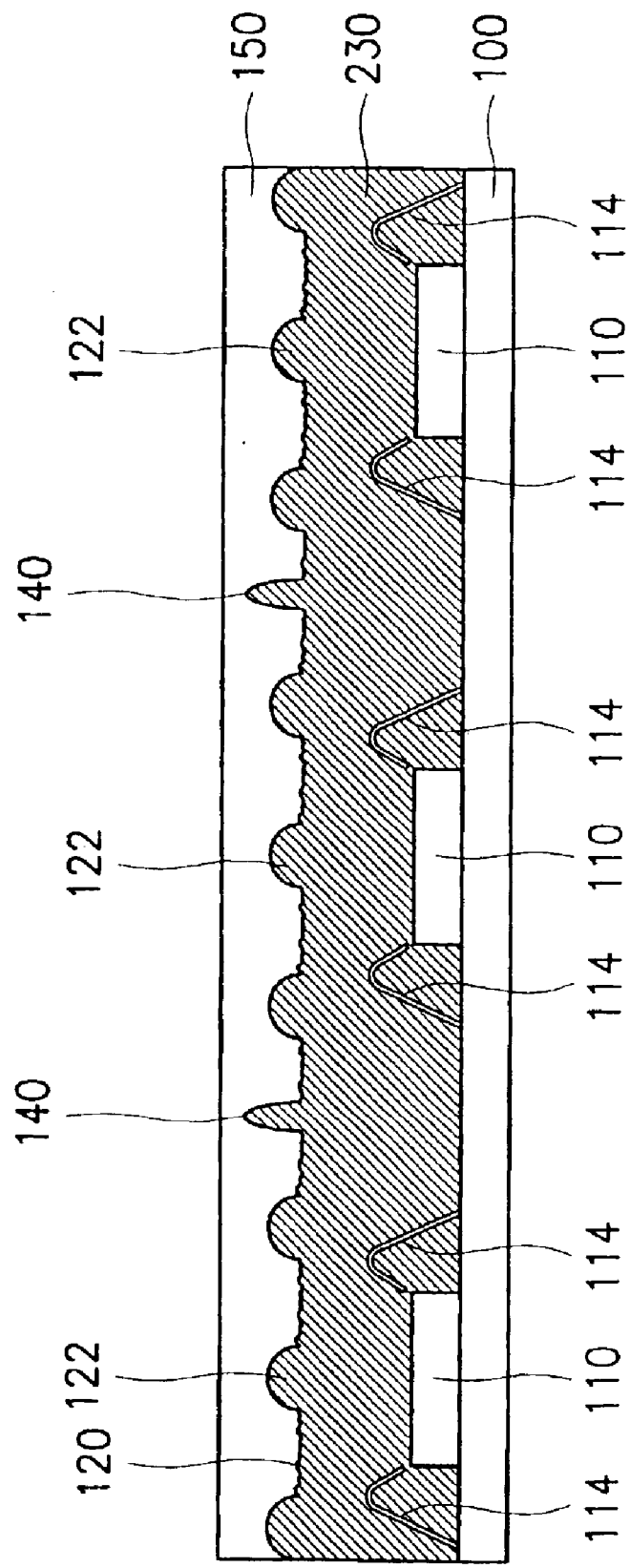
FIG. 6 is a cross-sectional view of an IC packages matrix with an integrally attached heat sink matrix according to another embodiment of the present invention.

Furthermore, as described in the first embodiment, a notch grid 140 (See FIG. 3A) constituted of a network of notches, which corresponds to the dividing lines for outlining each individual IC package 160, is pre-fabricated on the surface of the heat sink matrix 150 before being attached to the IC package matrix 190. The notch grid 140 is pre-fabricated on the surface of the heat sink matrix 150 by means of a machine tool or an etching step for the ease of separating the IC package matrix 190 and the overlapping heat sink matrix 150 into a plurality of IC packages 160 each having an integrally attached heat sink 170. As shown in FIG. 5, the notch grid 140 is formed on the top surface of the heat sink matrix 150 facing upwardly, which constitutes the dividing lines of the heat sink matrix 150. On the other hand, the notch grid 140 can also be formed on the bottom surface of the heat sink matrix 150 that faces towards the communal substrate 100 such that an adhesive is filled in the notch grid for enhancing the adhesion between the heat sink matrix 150 and the IC package matrix 190, as shown in FIG. 6.

As shown in FIG. 5, the encapsulated assembly comprises a large communal substrate 100 separable into a plurality of individual substrates defined by the dividing lines 141 extending directly below the notch grid 140 of the heat sink matrix 150; a plurality of semiconductor dies 110 fixedly disposed on the substrate 100 in a matrix arrangement; metal wires 114 electrically connecting corresponding bonds pads (not shown) of the semiconductor dies 110 to the communal substrate 100; a molding material 230 encapsulating both the semiconductor dies 110 and the metal wires 114 on the communal substrate 100; and a heat sink 150 attached to the molding material 230. Moreover, the bottom surface of the heat sink matrix 150 is provided with a plurality of dimples 122 for enhancing the adhesion between the heat sink matrix 150 and the IC package matrix 190 by allowing more molding material or other types of adhesive to be filled into the dimples.

Therefore, the present invention is related to an improved method of integrally attaching a heat sink 170 to an IC package 160 by first attaching a heat sink matrix 150, which is dividable into a plurality of individual heat sinks 170, to an IC package matrix 190, which is comprised of a plurality of individual IC packages 160 formed abutting each other in a matrix arrangement, in overlapping positions. The IC package matrix 190 and the heat sink matrix 150 attached thereto are simultaneously cut into a plurality of individually formed IC packages 160 each with a heat sink 170 integrally attached. Hence, the present invention provides the advantage of enhanced thermal conductivity of a conventional IC package without incurring a complex mounting technology required to maintain a high packaging throughput.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of manufacturing a plurality of IC (Integrated Circuit) packages each having an heat sink matrix integrally attached thereon, comprising the steps of:

providing a communal substrate;

attaching a plurality of semiconductor dies fixedly onto said communal substrate;

providing the heat sink matrix;

providing a molding apparatus, comprising:

a lower mold half for holding said communal substrate with said semiconductor dies fixedly attached thereon; and a upper mold half for holding said heat sink matrix;

wherein, said lower mold half and said upper mold half of the molding apparatus are combined in order to be filled by a melted molding material during a molding process and said heat sink matrix is held on said upper mold half by means of vacuum suction;

placing said communal substrate with said semiconductor dies fixedly attached thereon and said heat sink matrix into said molding apparatus;

filling the melted molding material into said molding apparatus to collectively encapsulate said semiconductor dies fixedly attached on said communal substrate and said heat sink matrix thereby forming an IC package matrix integrated with said heat sink matrix after said molding material is permanently set;

extracting said IC package matrix integrated with said heat sink matrix from the molding apparatus; and dividing said IC package matrix integrated with said heat sink matrix into said IC packages each having said heat sink integrally attached thereon.

2. The method as claimed in claim 1, wherein said IC package is a BGA (Ball Grid Array) package.

3. The method as claimed in claim 1, wherein said heat sink matrix is made of a copper material.

4. The method as claimed in claim 1, wherein said heat sink matrix is made of an aluminum material.

5. The method as claimed in claim 1, further comprising a step of coating a Cr film on said heat sink matrix before the step of placing said heat sink matrix into said molding apparatus.

6. The method as claimed in claim 1, further comprising a step of coating a chromium oxide film on said heat sink matrix before the step of placing said heat sink matrix into said molding apparatus.

7. The method as claimed in claim 1, further comprising a step of coating a Ni film on said heat sink matrix before the step of placing said heat sink matrix into said molding apparatus.

8. The method as claimed in claim 1, further comprising a step of forming a rough surface on said heat sink matrix before the step of placing said heat sink matrix into said molding apparatus.

9. A method of manufacturing a plurality of IC (Integrated Circuit) packages each having an heat sink matrix integrally attached thereon, comprising the steps of:

providing a communal substrate;

attaching a plurality of semiconductor dies fixedly onto said communal substrate;

providing the heat sink matrix;

forming a notch grid constituted of a network of notches on said heat sink matrix;

providing a molding apparatus;

placing said communal substrate with said semiconductor dies fixedly attached thereon and said heat sink matrix into said molding apparatus;

filling a melted molding material into said molding apparatus to collectively encapsulate said semiconductor dies fixedly attached on said communal substrate and said heat sink matrix thereby forming an IC package matrix integrated with said heat sink matrix after said molding material is permanently set;

extracting said IC package matrix integrated with said heat sink matrix from the molding apparatus; and dividing said IC package matrix integrated with said heat sink matrix into said IC packages each having said heat sink integrally attached thereon.

10. The method as claimed in claim 9, wherein said dividing step is conducted by cutting along said notch grid on said heat sink matrix integrated with said IC package matrix.

11. A method of manufacturing an IC (Integrated Circuit) package having a heat sink integrally attached thereon, comprising the steps of:

providing a substrate;

attaching a semiconductor die fixedly onto said substrate;

providing the heat sink;

providing a molding apparatus, comprising:

a lower mold half for holding said substrate with said semiconductor die fixedly attached thereon; and an upper mold half for holding said heat sink, wherein said lower mold half and said upper mold half of the molding apparatus are combined in order to be filled by a melted molding material during a molding process and said heat sink is held on said upper mold half by means of vacuum suction;

placing said substrate with said semiconductor die fixedly attached thereon and said heat sink into said molding apparatus;

filling the melted molding material into said molding apparatus to collectively encapsulate said semiconductor die fixedly attached on said substrate and said heat sink thereby forming an IC package integrated with said heat sink after said molding material is permanently set; and extracting said IC package integrated with said heat sink from the molding apparatus.

* * * * *